United States Patent [19]

Shimizu et al.

[11] Patent Number: 4,544,857

[45] Date of Patent: Oct. 1, 1985

[54] HIGH ELECTROMECHANICAL-COUPLING COEFFICIENT SURFACE ACOUSTIC WAVE DEVICE

[75] Inventors: Hiroshi Shimizu; Yasuyuki Mizunuma, both of Miyagi, Japan

[73] Assignee: NEC Corporation, Japan

[21] Appl. No.: 527,707

[22] Filed: Aug. 29, 1983

[51] Int. Cl.⁴ .............................................. H03H 9/25
[52] U.S. Cl. ........................... 310/313 B; 310/313 A; 333/154; 333/194
[58] Field of Search ............ 310/313 B, 313 R, 313 D, 310/313 A; 333/153, 194, 151, 154, 195

[56] References Cited

U.S. PATENT DOCUMENTS 3,795,879  3/1974  Whitehouse ........................ 333/72
4,480,237  10/1984  Yamada ............................. 333/193

OTHER PUBLICATIONS

Matthews, H., ed., "Surface Wave Filters", Wiley, 1977, pp. 26-37.

Primary Examiner—Peter S. Wong
Assistant Examiner—D. L. Rebsch
Attorney, Agent, or Firm—Sughrue, Mion, Zinn, Macpeak and Seas

[57] ABSTRACT

A high electromechanical-coupling surface acoustic wave device has a lithium niobate rotated Y-cut crystal as a piezoelectric substrate, and a thin high-density film formed on a predetermined portion of the lithium niobate rotated Y-cut crystal which includes at least a propagation path along which the surface acoustic wave propagates. A Love wave propagates in the thin or thick high-density film on the surface of the lithium niobate rotated Y-cut crystal substrate, so that the electromechanical coupling coefficient of the thin film can be improved, and spurious response caused by a Rayleigh wave can be eliminated.

7 Claims, 4 Drawing Figures

HIGH ELECTROMECHANICAL-COUPLING COEFFICIENT SURFACE ACOUSTIC WAVE DEVICE

BACKGROUND OF THE INVENTION

I. Field of the Invention

The present invention relates to a surface acoustic wave material and device and, more particularly, to a surface acoustic wave material and device having a high electromechanical coupling coefficient.

II. Description of the Prior Art

In order to achieve a compact surface acoustic wave device having a low insertion loss and a wide band, a piezoelectric substrate having a high electromechanical coupling coefficient is the most important requirement. Conventionally, a 128° lithium niobate rotated Y-cut crystal for Rayleigh waves, an SH (shear horizontal wave) type 41° lithium niobate rotated Y cut crystal for leaky surface waves, and SH type 36° and 64° lithium niobate rotated Y-cut crystals for leaky surface waves were proposed in the paper "Propagation and amplification of Rayleigh waves and piezoelectric leaky surface waves in LiNbO$_3$", by K. Yamanouchi et al (J.A.P., 43, P. 856–862, 1972) and in the paper "Some Simple Modes of Wave Propagation in an Infinite Piezoelectric Plate", by J. L. Bleustein (J., Acoust, Soc. Amer., 45, P. 614–619, 1969). However, the 128° lithium niobate rotated Y-cut crystal and the 36° lithium tantalate rotated Y-cut crystal described above have coupling coefficients of only 5.5% and 5%, respectively. The 41° lithium niobate rotated Y-cut crystal and the 64° lithium niobate rotated Y-cut crystal described above have coupling coefficients of 17.2% and 11.3%, respectively, thus attaining relatively high values. However, an abrupt propagation loss occurs in these crystals due to a shift in energy flow angle. This propagation loss is a characteristic problem.

SUMMARY OF THE INVENTION

It is an object of the present invention to provide a surface acoustic wave device having a high electromechanical coupling coefficient, where no abrupt propagation loss attributable to a deviation in energy flow angle occurs.

In order to achieve the above object of the present invention, there is provided a high electromechanical-coupling surface acoustic wave device having a lithium niobate rotated Y-cut crystal as a piezoelectric substrate, and a thin or thick high-density film formed on a predetermined portion of the lithium niobate rotated Y-cut crystal which includes at least a propagation path along which a surface acoustic wave propagates, the surface acoustic wave propagating in the thin or thick high-density film on the lithium niobate rotated Y-cut crystal substrate.

BRIEF DESCRIPTION OF THE DRAWINGS

The present invention will be best understood with reference to the accompanying drawings, in which.

DETAILED DESCRIPTION OF THE PREFERRED EMBODIMENTS

Figure 1:
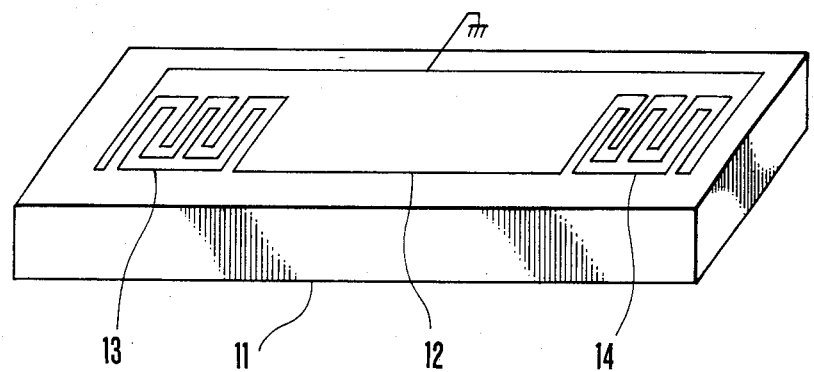
FIG. 1 is a perspective view of a surface acoustic wave device according to an embodiment of the present invention.

Referring to FIG. 1, there is provided a high electromechanical-coupling surface acoustic wave device. The device comprises a lithium niobate rotated Y cut crystal 11, a thin metal film 12 formed on a predetermined portion of the rotated Y-cut crystal 11 which includes at least a propagation path along which a surface acoustic wave propagates, and interdigital finger electrodes 13 and 14 for generating and receiving leaky surface waves, respectively. The thin or thick high-density film 12 is made of gold, silver, platinum or copper and has a high density, such that a Love wave propagates in the thin or thick high-density film 12 on the surface of the lithium niobate rotated Y-cut crystal substrate 11. In the device having the structure described above, the leaky surface waves excited by the electrode 13 propagate as Love waves (having no propagation loss) to the electrode 14 along the propagation path formed in the thin film 12.

Figure 2:
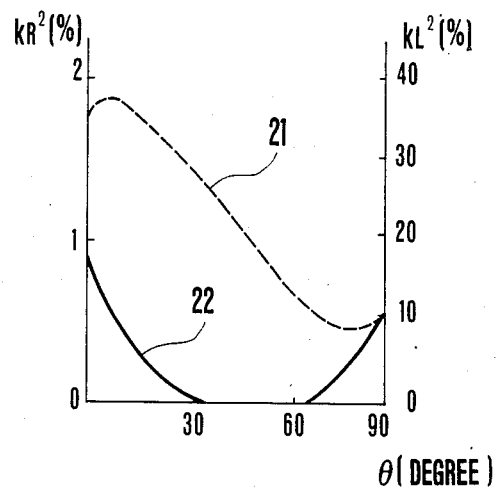
FIG. 2 is a graph showing the coupling coefficient as a function of the cut angle of the rotated Y-cut crystal.

FIG. 2 is a graph for explaining the relationships among a coupling coefficient K$^2_L$ of a Love wave 21, a coupling coefficient K$^2_R$ of a Rayleigh wave 22, and a cut angle $\theta$ of the lithium niobate rotated Y-cut cyrstal when a ratio H/$\lambda_N$ of a silver film thickness H to the wavelength $\lambda_N(=\sqrt{(C_{66}/\rho)}/f$ where $C_{66}$ is the material constant, $\rho$ is the density of the substrate, and f is the frequency) of the shear wave propagating within the lithium niobate rotated Y-cut crystal is given as $2.5 \times 10^{-2}$ when a silver film is formed on the lithium niobate rotated Y-cut crystal. Referring to FIG. 2, when the cut angle $\theta$ falls within a range between 30° and 60°, it is found that the Rayleigh wave is not excited, and hence no spurious response occurs. The coupling coefficient of the Love wave in this condition reaches 14% to 28%.

Figure 3:
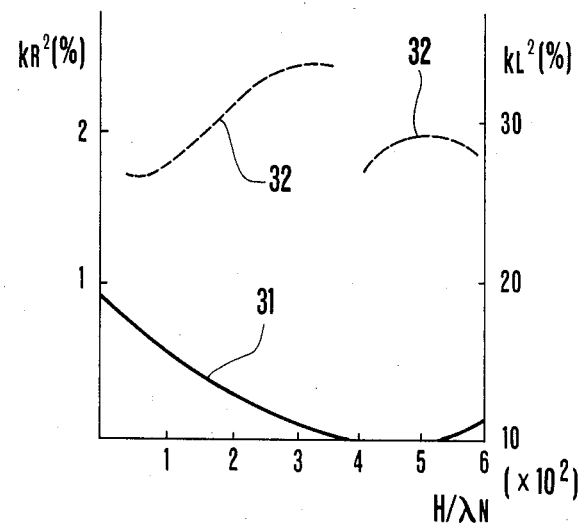
FIG. 3 is a graph showing the coupling coefficient as a function of a ratio H/$\lambda_N$ of the thickness H to the wavelength $\lambda_N$ of the surface acoustic wave.

FIG. 3 is a graph for explaining the relationships among the ratio H/$\lambda_N$ of a film thickness H to a wavelength $\lambda_N$ of the shear wave, a coupling coefficient K$^2_R$ of a Rayleigh wave 31 and a coupling coefficient K$^2_L$ of a Love wave 32 when a bismuth germanate film is formed on a 16° lithium niobate rotated Y-cut crystal. When the ratio H/$\lambda_N$ is set to be $4 \times 10^{-2}$ to $5 \times 10^{-2}$, the coupling coefficient of the Rayleigh wave becomes zero, and the coupling coefficient of the Love wave reaches 20% to 25%.

Figure 4:
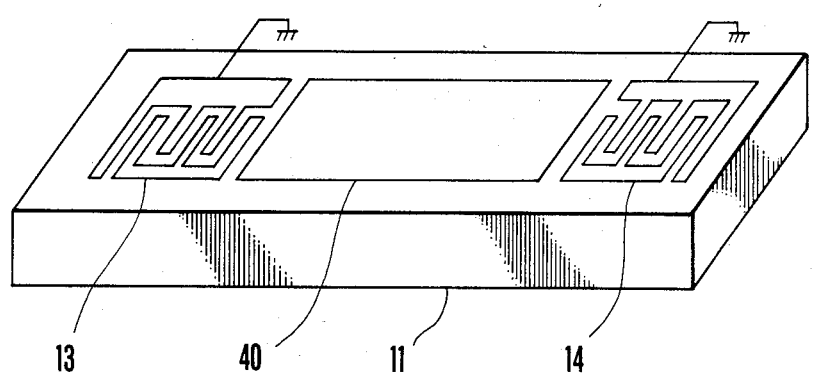
FIG. 4 is a perspective view of a surface acoustic wave device according to another embodiment of the present invention.

FIG. 4 shows a surface acoustic wave device according to another embodiment of the present invention. A thin dielectric film 40 of bismuth germanate, bismuth oxide, zinc oxide, or tungsten oxide instead of the thin metal film used in the embodiment shown in FIG. 1 is formed on a lithium niobate rotated Y-cut crystal. When bismuth oxide is used as a dielectric material, a coupling coefficient of about 30% can be obtained.

In summary, the present invention has advantages in that the electromechanical coupling coefficient can be improved and the spurious response conventionally caused by the Rayleigh wave can be eliminated.

What is claimed is:

1. A high electromechanical coupling surface acoustic wave device comprising a rotated Y-cut lithium niobate crystal substrate for propagating a Love wave mode along a propagation path, and a thin high density film formed on said propagation path on said substrate and having a thickness that reduces the electromechanical coupling coefficient of Rayleigh waves to zero.

2. A device according to claim 1, wherein said thin film is made of a metal.

3. A device according to claim 2, wherein said metal is selected from the group consisting of gold, silver, platinum and copper.

4. A device according to claim 1, wherein said thin film is made of a dielectric.

5. A device according to claim 4, wherein said dielectric is selected from the group consisting of bismuth germanate, bismuth oxide, zinc oxide, and tungsten oxide.

6. A device according to claim 3, wherein said metal is silver and an angle of rotation of said rotated Y-cut lithium niobate crystal is in the range of 30° to 60°.

7. A device according to claim 5, wherein said dielectric is bismuth germanate and the ratio $H/\lambda_N$ is in the range of $4 \times 10^{-2}$ to $5 \times 10^{-2}$, where H is the thickness of said film and $\lambda_N$ is the wavelength of a shear wave in said lithium niobate crystal corresponding to the frequency of said surface acoustic wave.

* * * * *